United States Patent

Jain

[11] Patent Number: 5,923,403
[45] Date of Patent: Jul. 13, 1999

[54] SIMULTANEOUS, TWO-SIDED PROJECTION LITHOGRAPHY SYSTEM

[75] Inventor: Kanti Jain, Briarcliff Manor, N.Y.

[73] Assignee: Anvik Corporation, Hawthorne, N.Y.

[21] Appl. No.: 08/889,307

[22] Filed: Jul. 8, 1997

[51] Int. Cl.⁶ .................................................. G03B 27/32
[52] U.S. Cl. ............................................. 355/26; 355/53
[58] Field of Search ................................. 355/26, 53, 67, 355/77, 43–45, 91, 94, 73, 76

[56] References Cited

U.S. PATENT DOCUMENTS

| | | | |
|---|---|---|---|
| 3,937,579 | 2/1976 | Schmidt | 355/132 |
| 4,190,352 | 2/1980 | Bruning | 355/26 |
| 4,537,478 | 8/1985 | Richter | 355/26 |
| 4,721,980 | 1/1988 | Yazaki | 355/26 |
| 4,924,257 | 5/1990 | Jain | 355/53 |
| 5,258,808 | 11/1993 | Watanuki | 355/26 |
| 5,272,502 | 12/1993 | Saiki | 355/26 |
| 5,285,236 | 2/1994 | Jain | 355/53 |
| 5,652,645 | 7/1997 | Jain | 355/53 |

FOREIGN PATENT DOCUMENTS 9-129546  5/1997  Japan ........................................... 3/53

*Primary Examiner*—D. Rutledge
*Attorney, Agent, or Firm*—Carl C. Kling

[57] ABSTRACT

This projection imaging system is capable of simultaneously exposing both the upper and lower sides of a substrate while providing high-resolution, a large exposure area, and high exposure throughput. The system comprises:

(a) a single stage, holding a substrate, upper mask, and lower mask in fixed juxtaposition, that is capable of scanning in one direction, and when not scanning in that direction, capable of moving laterally in a dimension perpendicular to the scan direction so as to position itself for another scan parallel to the original scan;

(b) an illumination system having an effective source plane of a predetermined shape, capable of simultaneously illuminating on both the upper and lower masks a region of the above predetermined shape;

(c) an upper and lower projection system having an object to image magnification ratio of unity, each having a reverser assembly to render both the upper and lower images on the substrate in the same orientation as the mask pattern:

(d) a fixed offset, lateral to the optical axis, is provided by each reverser assembly, between each mask and the substrate, the offsets for the two masks being equal and in opposite directions from the substrate; and (e) provision for additive illumination in overlap regions of areas exposed by adjacent scans such that the effect of the exposure dose delivered in the overlap regions is seamless and uniform with respect to the entire substrate.

22 Claims, 5 Drawing Sheets

For Discussion Only

SIMULTANEOUS, TWO-SIDED PROJECTION LITHOGRAPHY SYSTEM

FIELD OF THE INVENTION

This invention relates to projection lithography systems capable of imaging large substrates in a seamless scanning fashion, and it specifically relates to a seamless scanning projection lithography system capable of simultaneously imaging the upper and lower first and second sides of a substrate, using two different masks.

DESCRIPTION OF RELATED ART

Economical manufacturing of electronic and optoelectronic components require the fabrication of a great number of microscopic structures on a single large substrate. These structures can be active devices, such as transistors in a flat panel display (FPD) or integrated circuit (IC). The structures may also be passive patterns, such as interconnecting conductors on a printed circuit board (PCB) or multichip module (MCM). The large substrate can be a board, a display panel, a silicon wafer, or a roll of flexible substrate material. Both the pattern size and the substrate size can vary greatly depending on the application. IC patterns contain sub-micron features as well as multi-micron details, while FPDs, MCMs, and PCBs may have multi-micron details. The actual substrates used can also vary from several square inches for small modules to several square feet for PCBs and FPDs. Common to all of the applications is the requirement that the system used to produce them has the required resolution over the entire substrate.

To achieve economical manufacturing, the high cost of production equipment must be offset by high throughput. To increase throughput and yield, substrate handling must be minimized to reduce the overall processing time, and also to avoid damage and contamination. This may be accomplished by processing both surfaces of the substrate simultaneously, with perfect alignment between them so that electrical connections may be made from the top surface pattern to the bottom surface pattern by interconnections called plated via-holes.

There are three primary types of patterning systems currently available: contact printing systems, projection imaging systems, and focused-beam laser direct writing systems.

Contact printing suffers from two inherent disadvantages: generation of defects during patterning, and mask life degradation. Defects during patterning are caused by the mask coming into repeated contact with the photo-resist coated surface. Frequent mask-to-substrate contact also shortens mask life, adding to overall cost. This problem is partially overcome with proximity printing where a uniform gap is maintained between the substrate and the mask. However, any variation in the gap results in feature size or shape variation. As panel size increases, it becomes more difficult to maintain a uniform mask-to-substrate gap.

Conventional single-field projection imaging systems eliminate the disadvantages of contact printing resulting from defects and wear, but are limited in the largest substrate size they can expose due to their small image field. Step-and-repeat projection systems overcome this constraint by partitioning the substrate into several segments; however, this decreases throughput and creates the difficult requirement of precisely stitching the segments together. This does not pose a problem when the feature being exposed is smaller than the image field, but when the entire substrate is one continuous pattern, defects due to stitching errors significantly reduce production yields.

Laser direct writing systems, which write the pattern on the substrate with a focused raster-scanning beam, suffer from an inherently slow speed due to their bit-by-bit, serial mode of addressing. Due to serial addressing, the processing times for direct-writing systems are long, ranging from a few minutes to a few hours per substrate, depending upon the resolution and complexity of the pattern data. Direct write systems are not cost effective for high volume processing, but are used for mask fabrication and making component prototypes.

Thus, existing technologies for microelectronic patterning suffer from major shortcomings, including defect generation on the substrate, mask wear, limitations on resolution or field size, low throughput, and the inability to expose both sides of a substrate simultaneously. During typical printed circuit board (PCB) patterning, front and back imaging are individual process steps. Precision alignment between the two sides is difficult to achieve and the two-step process is time consuming and expensive. This problem is multiplied when the PCB consists of multiple layers requiring precision alignment between the different layers. The alignment problem is further complicated if the substrate being exposed is a continuously fed roll-to-roll flexible substrate, because of flexure stresses which can affect alignment and because of passage of time between exposures. Currently, one entire side of the roll must be exposed before the roll can be inverted and exposed on the reverse side, requiring the alignment of the second mask, for each exposure, to a pre-exposed feature on the first side—or the roll must be turned and the mask changed and aligned after each exposure.

Ideally, one desires the throughput of contact printers as well as the high resolution available from projection imaging and direct writing, without any of the disadvantages of the three technologies. There is a great need for the development of patterning equipment for the fabrication of electronic products which combines these major performance attributes: high processing throughput, high resolution, the ability to handle large substrate sizes, and the ability to accurately and economically pattern both sides of a substrate simultaneously.

An imaging technology which achieves many of these objectives has been described by this inventor in U.S. Pat. No. 5,285,236, Large-Area, High-Throughput, High-Resolution Projection Imaging System, issued Feb. 08, 1994. The referenced patent discloses a projection imaging system in which an integrated stage assembly for both mask and substrate is used for the seamless exposure of a large area substrate in which high throughput and high resolution are achieved, but does not address the two sided exposure of substrates.

SUMMARY OF THE INVENTION

This invention discloses a projection imaging system in which the objective of simultaneous seamless exposure of both top and bottom surfaces of large area substrates using two different masks is achieved. The lithography system described in this invention makes it possible to image a substrate, such as a printed circuit board or a display panel, on both sides simultaneously, with perfect alignment between the two sides, using two different masks and a single illumination source. For seamless projection exposure of large areas, the system uses the concepts described in this inventor's previous patents, notably U.S. Pat. No. 4,924, 257, Scan and Repeat High-Resolution Projection Lithography System, issued May 05, 1990; U.S. Pat. No. 5,285, 236, Large-Area, High-Throughput, High-Resolution Projection Imaging System, issued Feb. 08, 1994, and High-Throughput, High-Resolution, Projection Patterning System for Large Flexible, Roll-Fed, Electronic Module Substrates, application Ser. No. 08/506,232, now U.S. Pat. No. 5,652,645. However, the prior-art systems are limited to imaging only one side of a substrate at a time; in other words, they are one-sided. This invention takes advantage of a certain fundamental design feature of these previously disclosed one-sided large-area projection exposure systems and develops a new projection imaging system that can image both sides of a substrate simultaneously, while retaining the benefits of the large-area, high-throughput, high-resolution, seamless scan and repeat exposure techniques of the one-sided systems.

Simultaneous processing of both sides of a substrate increases throughput not only by reducing the processing time but by reducing the setup time as well. Once the upper and lower first and second masks are aligned, both sides of the substrate can be patterned in one exposure operation. This can be repeated for processing subsequent substrates without the need to realign the masks, although a periodic verification of alignment might be appropriate. In contrast, when using a system that only processes one side of a substrate at a time, there is a risk of damage to the substrate while positioning it for exposure of the second side after the first side has been exposed. In addition, one faces the problem of aligning the patterns on both sides of every substrate for each subsequent process. This invention describes a system technology that delivers all of the desired performance and cost features in a patterning system, namely, two-sided, high-resolution, high-yield, large-area, and high-throughput capability.

In this invention, the two masks having the patterns to be produced on the two sides of the substrate, the upper mask and the lower mask, are mounted with the substrate on the same side of a planar, high-speed scanning stage. An imaging system, which is called the 'upper imaging assembly,' comprising a projection lens and associated folding optics, is situated on the upper side of the scanning stage, in such a way that an image of the upper mask is formed on the upper surface of the substrate. Since this imaging assembly includes a reversing assembly that offsets the image from the mask in a direction lateral to the optical axis of the image train, the upper mask is therefore placed on the stage with a corresponding lateral offset from the substrate so that it will image on the upper side of the substrate with the proper registration. The reverser assembly is designed so that the lateral offset is slightly larger than half the mask dimension in the direction of the offset. As described below, the lateral offset is slightly larger than half the mask dimension in the direction of the offset so as to allow both the upper and lower masks to be mounted on the stage side by side.

On the same stage, adjacent to the upper mask, the lower mask is situated with the same lateral offset from the substrate as the upper mask but in the opposite direction. Next, the 'lower imaging assembly,' optically identical to the upper imaging assembly, is situated on the lower side of the stage. The position of the lower mask and its reverser assembly are configured so that an image of the lower mask is formed on the bottom of the substrate with the proper registration. Thus the two masks, using two imaging assemblies, can be imaged simultaneously on the upper and lower sides of the substrate, in perfect alignment with each other and with the substrate. The scan and repeat motion of a single planar scanning stage, with the upper and lower imaging systems, including offsets, enables two-sided, high-resolution, high-throughput exposure of a large substrate.

It is the object of this invention to provide a projection imaging system capable of simultaneously exposing both sides of a large substrate uniformly, with high resolution, and high production rates, and in perfect alignment.

Another object of this invention is to provide a two-sided projection imaging system that uses a single illumination source.

A feature of this invention is its ability to pattern a variety of large substrates using a scan and repeat exposure mechanism that seamlessly exposes the entire substrate in a uniform manner by overlapping adjacent complementary hexagonal scans.

Another feature of the invention is the ability to pattern a variety of substrates on both sides simultaneously, including individual rigid substrates or segments of flexible, roll-fed, electronic module substrates, or other substrate configurations.

Another feature of the invention is the provision of two uniform hexagonal illumination beams from a single light source.

Another feature of the invention is that the upper and lower masks and the substrate are all held on a single stage, thus providing ease of automatic alignment.

An advantage of the invention is the ability to process both sides of a substrate simultaneously, eliminating handling during processing and defects caused from that handling.

Another advantage of the invention is the reduction in setup time because, after setup, the upper and lower masks are permanently aligned to each other for all substrates, and do not have to be individually and separately aligned for each substrate.

Another advantage of the invention is that its simultaneous two-sided imaging with automatic alignment more than doubles processing throughput over that of one-sided exposure systems.

Another advantage of the invention is its ability to provide both high-resolution and large exposure area, without the associated problems of the prior-art patterning methods.

Another advantage of the invention is that there is a large working distance between the scanning stage and the optics, which provides the ability to incorporate automatic substrate loading and unloading equipment in a two-sided imaging system.

Other objects, feature, and advantages of the invention will be apparent from the following specification and from the annexed drawings and claims.

DETAILED DESCRIPTION OF THE PREFERRED EMBODIMENT

Figure 1:
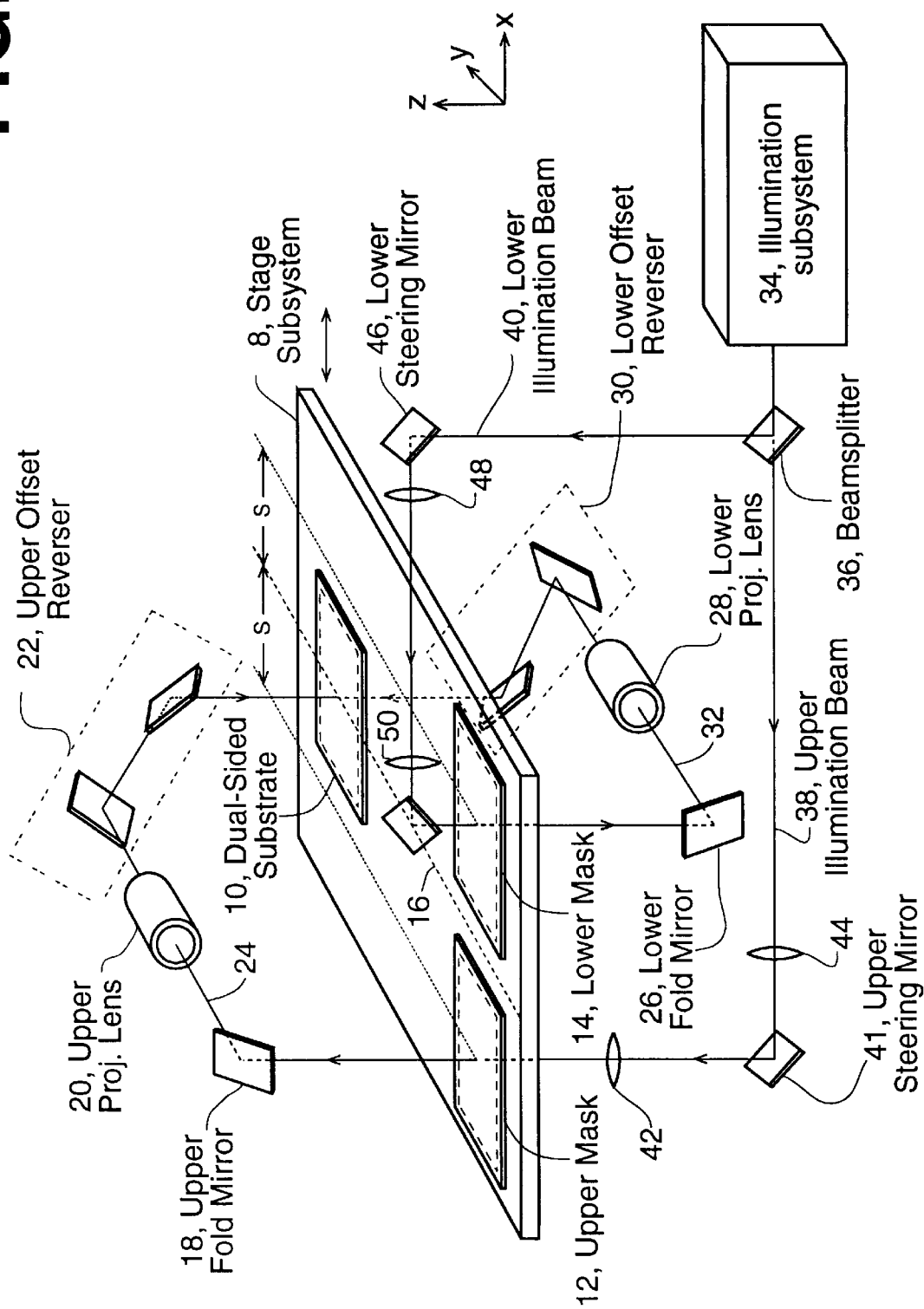
FIG. 1 shows a first preferred embodiment of a two-sided projection lithography system showing an illumination system, an x-y stage, a two-sided substrate, upper and lower masks, upper and lower projection lens assemblies, and upper and lower reversers. The stage scans longitudinally in the x-direction and moves laterally in the y-direction between scans.

FIG. 1 shows an embodiment of the invention configured for simultaneously patterning both sides of an individual, rigid substrate. Two-sided substrate 10, upper mask 12, and lower mask 14 are shown mounted on planar scanning stage 8. The substrate 10 is placed such that the y-direction central axis, 16, of the stage, 8, runs through the center of the substrate 10. The upper mask 12 is mounted on the stage 8 with a lateral offset, S, in the negative x direction with respect to the axis 16. The lower mask 14 is mounted on the stage 8 with the same magnitude of lateral offset, S, as the upper mask 12, but in the positive x direction with respect to the axis 16. An upper imaging assembly, situated on the upper side of the stage 8, comprises an upper fold mirror 18, upper projection lens 20, and upper offset reverser assembly 22. The optical axis 24 of the upper imaging assembly is aligned with the center line of the upper mask 12. The upper reverser 22 is designed so the lateral offset, S, is equal to the offset between the center line of the upper mask 12 and the central y-axis 16 of the stage 8.

Figure 3A:
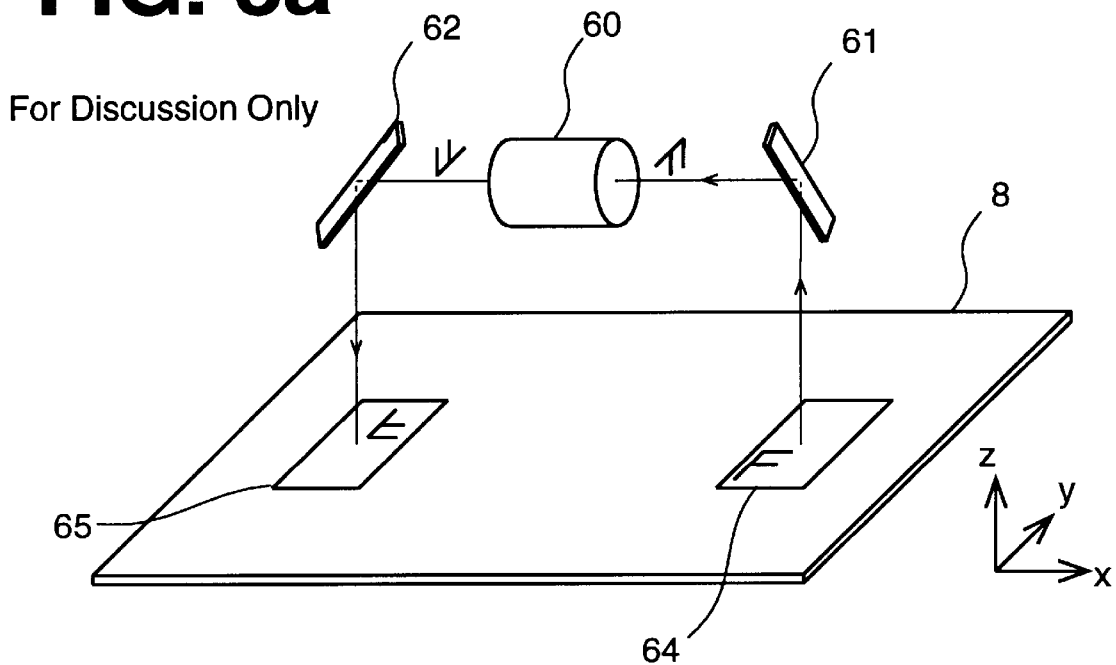
FIG. 3a, shown for discussion only, displays the problems inherent in a refractive projection imaging system without a reverser in the imaging assembly when used with a single-stage mask-substrate scanning system, illustrating how the image of an object is reversed, making it impossible to scan the mask and substrate together in the same direction.
Figure 3B:
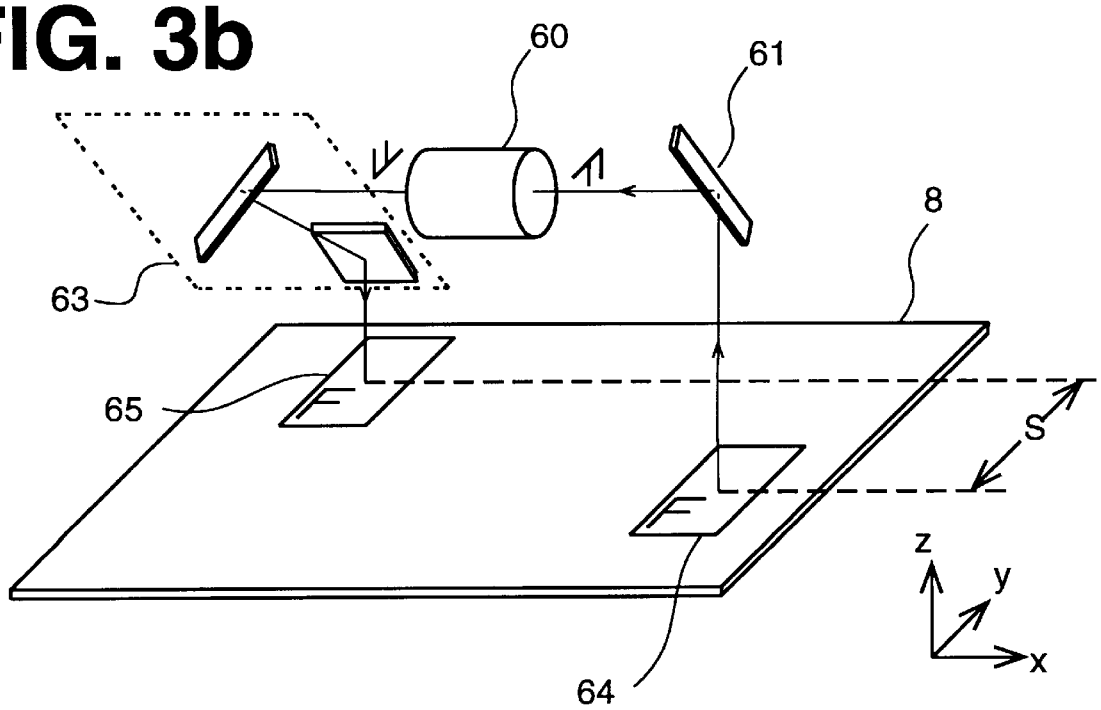
FIG. 3b shows a refractive projection imaging system with a reverser in the imaging assembly, as implemented in this invention, illustrating how the image has the same orientation as the mask, thereby enabling mounting of the mask and substrate on a single stage and scanning them together in the same direction.

If, in place of the reverser 22, we had a simple fold mirror 62, as shown in FIG. 3a, the image orientation would not be the same as the object orientation. Orientation would be the same along the x-axis but reversed along the y-axis. Since both the substrate and mask are mounted to the same stage, no scanning can take place as the substrate and mask must move in opposite directions for complete imaging. This limits the size of the substrate to be imaged to the projection lens image area. When the simple fold mirror 62 of FIG. 3a is replaced by a reverser 63, realized as two mirrors in FIG. 3b, image orientation identical to the mask orientation is obtained. Once the reverser is added, the substrate and mask can be mounted to the same stage and scanned simultaneously since they now move in the same direction and enable the imaging of the entire substrate. The reverser 22 does double duty; it is positioned to produce not only the non-reversed image, but also the lateral offset S. The lateral offset S permits the upper and lower masks, lying side by side, to be imaged simultaneously in exact alignment on top and bottom of substrate 10.

A second imaging assembly, the lower imaging assembly, is situated on the lower side of the stage 8; it comprises lower fold mirror 26, lower projection lens 28, and lower reverser offset assembly 30. The optical axis 32 of the lower imaging assembly is aligned with the center line of lower mask 14. The offset reverser assembly 30 is designed so the lateral offset S is equal to the offset between the center line of the lower mask 14 and the central y-axis 16 of the stage 8. Such an arrangement of the upper and lower masks, the substrate, and the upper and lower imaging assembly ensures that the images of the upper and lower masks fall on opposite sides of the substrate and are exactly registered with each other. Therefore, by a scan and repeat motion of the stage in the x-y plane, the entire substrate can be exposed on its upper and lower sides simultaneously with images of, respectively, the upper and lower masks. This eliminates the need, as would be the case in a one-sided system, to turn the substrate over after exposure of the first side and to realign it for exposing the second side. The result is not only greater throughput, but also reduced substrate handling, and thereby, fewer defects and greater yield.

To further increase the throughput, automatic substrate handling equipment can be incorporated into this invention. Automating the loading and unloading insures that the substrate is positioned in nearly the same relative location for each patterning operation. This not only reduces the setup time, but also further decreases defects caused from handling the substrate during loading and positioning.

A single illumination subsystem 34 can be used to illuminate both the upper and lower masks. A 50/50 beam splitter 36 and associated upper and lower steering optics enable the simultaneous illumination of both the upper and lower masks. Simultaneous illumination with a single source eliminates the expense of a second source, which is of particular importance in the case of the excimer laser, where the single source may cost up to $500,000. The single source also eliminates the problem of synchronizing the output pulses from two different sources.

Figure 2:
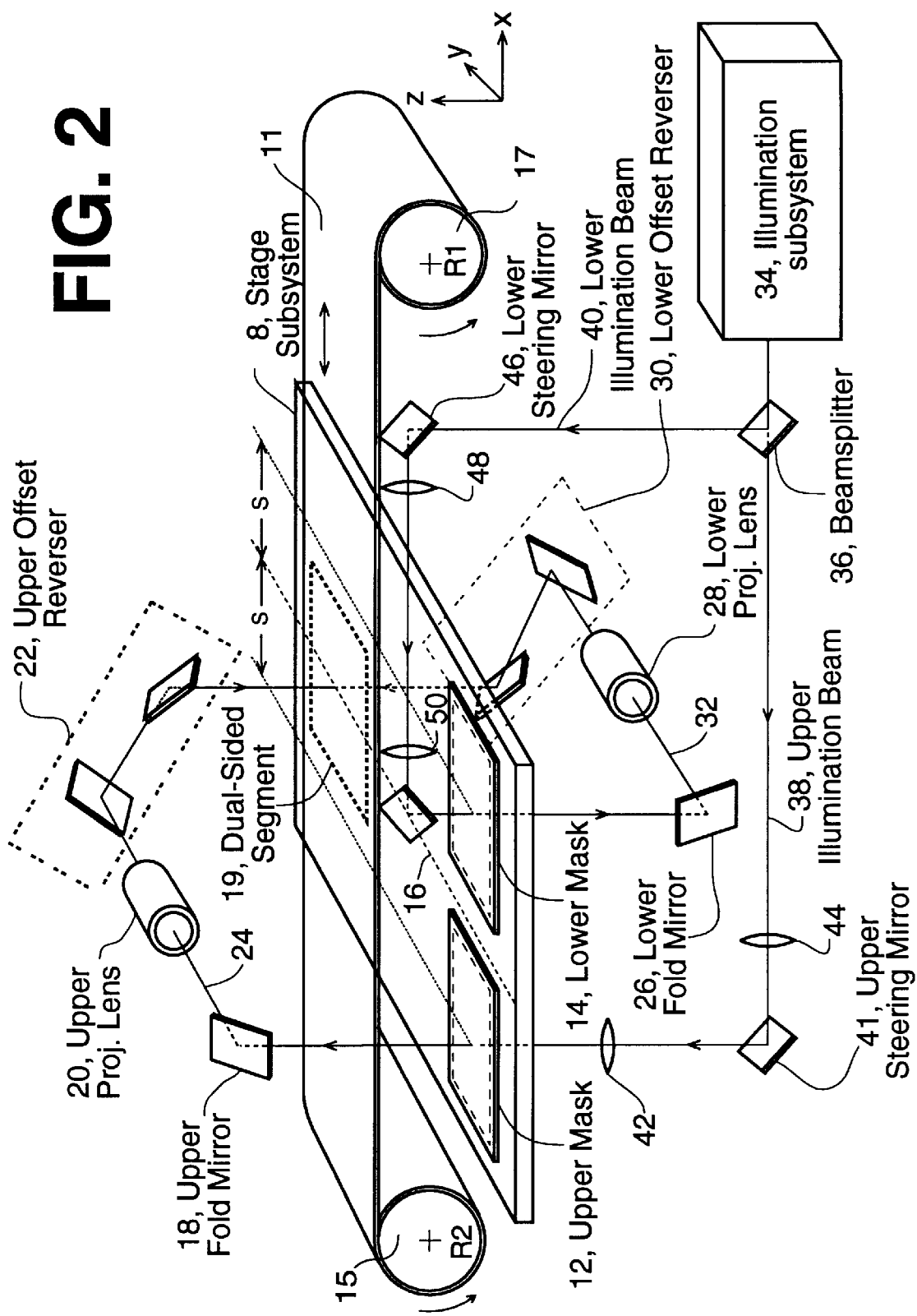
FIG. 2 shows a second preferred embodiment of a two-sided projection lithography system showing an illumination system, an x-y stage with upper and lower masks, a continuously fed roll-to-roll flexible substrate, upper and lower projection lens assemblies, and upper and lower reversers. The stage scans longitudinally in the x-direction and moves laterally in the y-direction between scans.

FIG. 2 shows a second embodiment of the invention. Here, instead of an individual substrate 10, a flexible roll-fed substrate 11 is used. The material is fed from supply roller 17 to take-up roller 15. A substrate segment 19 is positioned on the stage 8, and both sides of the substrate segment are simultaneously exposed by a scan-and-repeat movement, as before. After the segment is exposed, the roll 11 is advanced and a new segment is ready to be exposed.

Again, a key element in this invention is the offset reverser assembly (22,30) in both the upper and lower imaging assemblies. The offset reverser assemblies are preferably identical and therefore provide the same magnitude of offset in both the upper and lower imaging trains. Since the upper and lower images are non-reversed, both the mask and substrate travel in the same direction during patterning and can be mounted to the same stage. The offsets in the reversers allow both the upper and lower masks to be mounted side by side, thus enabling simultaneous patterning on both sides of the substrate.

It is important to note that in any embodiment of the invention the upper and lower optical path lengths are of equal lengths between the masks and substrate. This insures identical imaging and illumination parameters for the two sides. This also reduces set-up time by allowing the user to determine and set the exposure intensity required on one side of the substrate only, since both imaging paths are identical.

Figure 4:
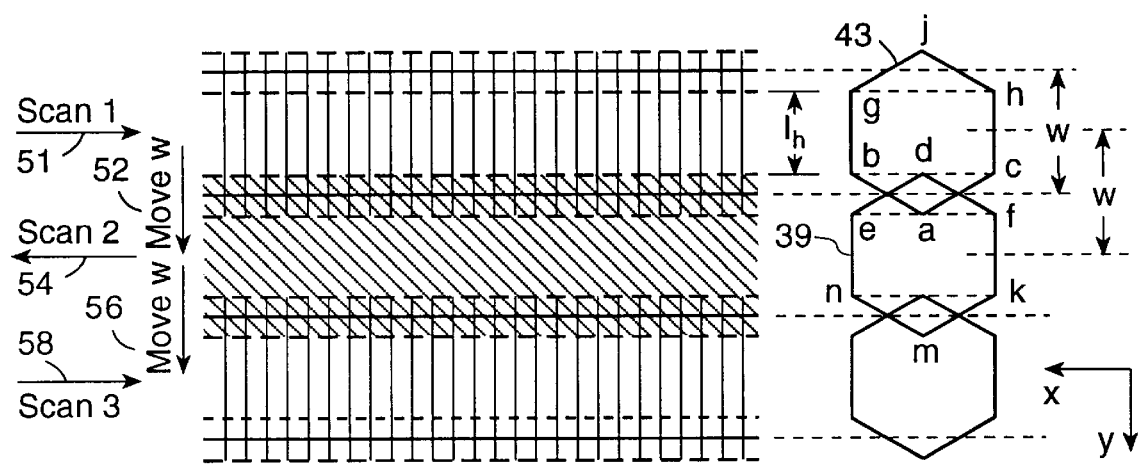
FIG. 4 illustrates the hexagonal cross section of the illumination beam and the scan-and-repeat mechanism. There are three adjacent scans shown overlapping. The complementary exposure in the overlap regions generate the seamless transition between adjacent scans. The figure also shows the scan direction alternating between +x and −x, and the lateral movements of w in the y direction between scans.

FIG. 4 illustrates the details of the mechanism of seamless overlapping hexagonal scanning. The regular hexagon 43, also shown as a-b-g-j-h-c, represents the illuminated region on the mask at any time. The first x-scan of the substrate across its hexagonal exposure region is depicted as scan 1, or 51. The orientation of the hexagon 43 is such that one of its sides, for example b-g, is orthogonal to the scan direction. After completion of scan 1, the stage is moved along y by the effective scan width w (52) shown in FIG. 4. This new position of the hexagonal exposure region, relative to the substrate, is 39, also shown as d-e-n-m-k-f. Now scan 2 (54), is generated by scanning the stage in the reverse direction. At the end of scan 2, the substrate is again moved by a distance w (56), the scan direction is again reversed, and scan 3 (58) is generated, and so on. Thus, in this preferred embodiment, the scan direction alternates between right-to-left and left-to-right. In an alternate embodiment, one may have all scans in the same direction; in this case, at the end of each scan the stage is returned to its previous starting position and moved laterally by w before beginning the next scan.

Figure 5:
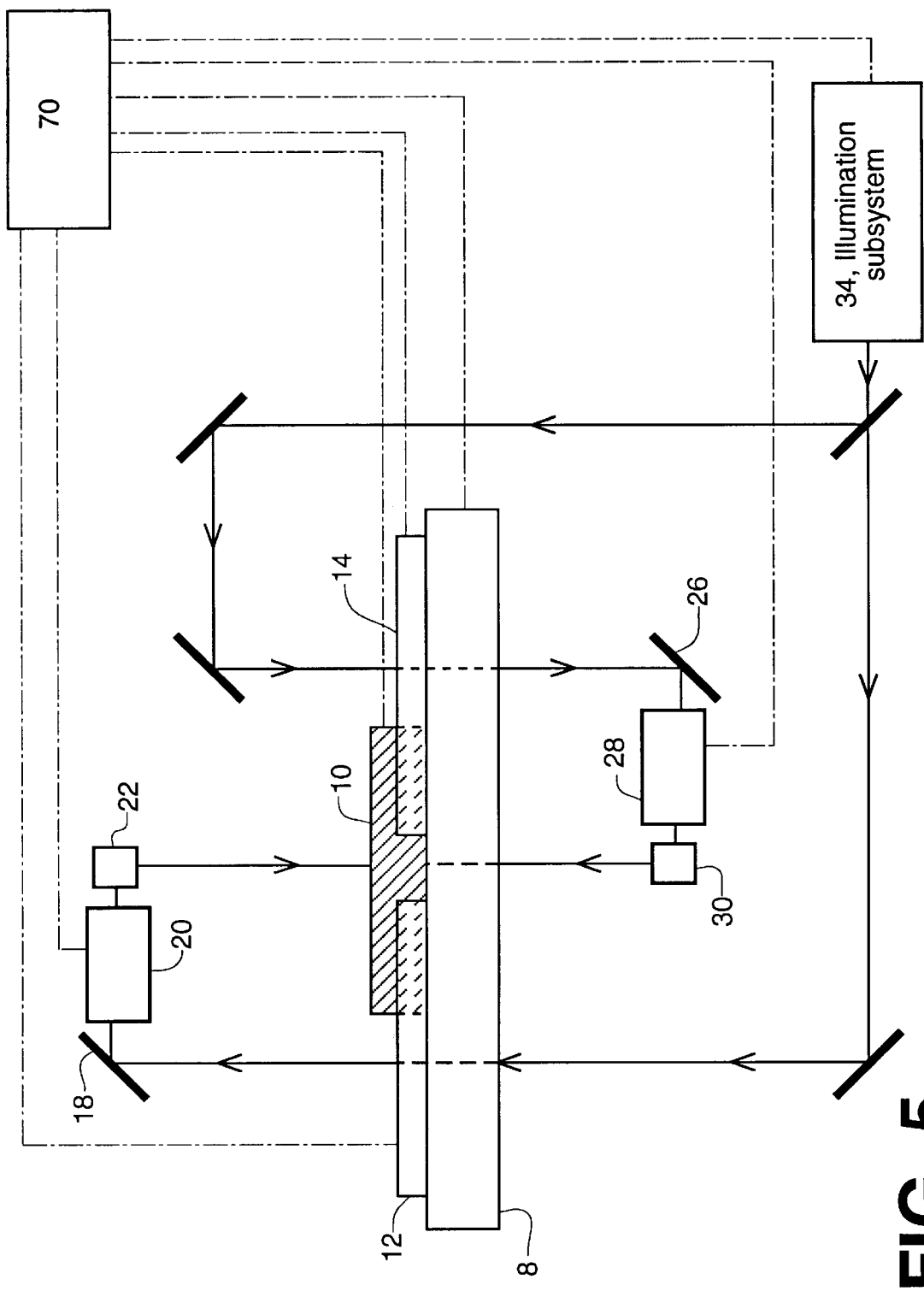
FIG. 5 schematically represents the control means inter-relating the various subsystems of the two-sided projection imaging system.

FIG. 5 schematically represents the control means 70 operatively interrelating various subsystems of the two-sided projection imaging system. As shown, the control means 70 controls the movement of the stage 8 as well as said illumination system 34 to provide additive illumination in certain overlap regions of areas exposed by adjacent scans such that the exposure dose delivered in said overlap regions is seamless and the effect of the exposure dose delivered across each entire substrate segment is uniform. The control means also maintains proper alignment of the upper mask 12, the lower mask 14, and the substrate 10. Said control means is also capable of adjusting the focus of the upper projection lens 20 and the lower projection lens 28.

In any implementation of the disclosed invention, the source in the illumination system 34 is selected to optimally match the exposure requirements of the radiation-sensitive material applied on the substrate (10, 11). For a majority of photoresist materials, a mercury lamp is appropriate as the illumination source. In most cases, however, significantly greater throughput is achieved by use of excimer lasers, which are attractive for both wet and dry patterning of resists and polymers.

Whereas the preferred embodiments, as described above, have the objective of exposing both sides of a substrate simultaneously, the apparatus of the invention may also be used for simultaneous multi-segment illumination of single-sided substrates which may be discrete and rigid, or continuous and flexible. It is also possible to use the apparatus of the invention with substrates which are rendered into a temporarily two-sided configuration. Such configurations may be simultaneously imaged and then separated into single-surface patterned substrate segments.

The number of optical illumination and imaging assemblies that may be used with a single laser may be two or more, as long as each optical assembly is matched with others to have the same optical imaging path length and other characteristics to provide the necessary exposure intensity and image orientation.

This invention may also be used to simultaneously pattern a substrate with a plurality of sides, i.e. a substrate with a polygonal cross-section. For each of the $S_1, S_2 \ldots S_n$ sides of the substrate there is a corresponding mask $M_1, M_2 \ldots M_n$ and projection system $P_1, P_2 \ldots P_n$.

The offset, normally ±S, may be asymmetrical if desired, as long as the offsets aggregate the amount of mask displacement. The offset reverser assemblies 22/30 may include a prism, in which case one or more fold mirrors should be moveable to adjust the optical path length. The offset reverser assemblies 22/30 may include two fold mirrors, in which case the reverser unit or another fold mirror should be moveable to adjust the optical path length.

The stage subsystem 8 may be equipped with an adjustment for the relative offset of upper mask 12 and lower mask 14, to increment or replace the offset adjustment capability of the offset reverser assemblies.

METHOD OF OPERATION

The invention describes a method of providing a two-sided large-area, high-throughput, high-resolution scan-and-repeat patterning system using the following steps:

1. providing a stage subsystem comprising mask locking means and substrate locking and adjustment means which enable fixed juxtaposition of the masks (12, 14) relative to the substrate (10/19); said stage subsystem being capable of scanning in one dimension, and when not scanning in that dimension, capable of moving laterally in a direction perpendicular to the scan direction so as to position itself for another scan;

2. providing an illumination subsystem having the wavelength and intensity distribution characteristics suited for exposure of the substrate (10/19), having an effective source plane of a predetermined shape, and capable of illuminating each of the masks (12, 14) with a region of said predetermined shape;

3. providing two projection subsystems (18, 20, 22/26, 28, 30) for imaging the illuminated regions of predetermined shape on both the upper mask (12) and lower mask (14) onto both the upper and lower sides of the substrate (10/19), having an object-to-image magnification ratio of unity, having the desired imaging resolution, having reverser means (22/30) to render the images on the substrate in the same orientations as the object mask patterns and each with a predetermined lateral offset, and having an image field of said predetermined shape and of an area substantially smaller than the substrate area;

4. scanning the stage 8 such that the lengths of both masks traverse said illumination regions of predetermined shape;

5. stopping the stage momentarily after completion of a scan across the length of the masks, moving the stage by a distance equal to 1.5 $l_h$ in a direction perpendicular to the scan direction, and resuming the scanning of the stage in a direction opposite to the scan direction in step 3;

6. repeating steps 4–5 until exposure of both sides of the entire substrate is completed.

4. providing control means 70 to operatively interrelate said stage (8), said illumination subsystem (34) and said projection subsystems (18, 20, 22/26, 28, 30) to provide additive illumination in certain overlap regions of areas exposed by adjacent scans such that the effect of the exposure dose delivered in said overlap regions is seamless and the effect of the exposure dose delivered across each entire substrate segment is uniform, and to periodically realign the upper mask (12), the lower mask (14) and the substrate (10/19)

While the invention has been shown preferably through the embodiments illustrated in FIGS. 1 and 2, it will be clear to those skilled in the art that the modifications described as alternatives, and other alternatives, may be pursued without departing from the spirit and scope of the invention, as defined in the following claims.

What is claimed is:

1. A two-sided, large-area, high-throughput, high-resolution, scan-and-repeat projection imaging system for replicating patterns present on first and second patterning masks onto substrate segments on two sides of a substrate, characterized by (a) a stage subsystem (8) comprising mask locking means and substrate locking means providing fixed juxtaposition of the masks (12, 14) in a common plane relative to the substrate (10/19); said stage subsystem being capable of scanning in one dimension, and when not scanning in that dimension, capable of moving laterally in a direction perpendicular to the scan direction so as to position itself for another scan; said stage subsystem thus being capable of exposing the full substrate by scanning the substrate area in a certain number of parallel strips, exposing each of said strips by scanning the length of the strip across a fixed illumination region;

(b) an illumination subsystem (34) having the wavelength and intensity distribution characteristics suited for exposure of said substrate (10/19), having an effective source plane of a predetermined shape, and capable of illuminating each of said masks (12, 14) with a region of said predetermined shape;

(c) a set of at least two projection subsystems (18, 20, 22/26, 28, 30) for imaging said illuminated regions of said predetermined shape on both the first mask (12) and second mask (14) onto both the upper and lower sides of the substrate (10/19), having an object-to-image magnification ratio of unity, having the desired imaging resolution, having reverser means (22/30) to render the images on the substrate in the same orientations as the object mask patterns and each with a predetermined lateral offset, and having an image field of said predetermined shape and of an area substantially smaller than the substrate area; and (d) control means 70 to operatively interrelate said stage (8), said illumination subsystem (34) and said projection subsystems (18, 20, 22/26, 28, 30) to provide additive illumination in certain overlap regions of areas exposed by adjacent scans such that the effect of the exposure dose delivered in said overlap regions is seamless and the effect of the exposure dose delivered across each entire substrate segment is uniform.

2. A two-sided projection imaging system according to claim 1, further characterized in that (a) said illumination subsystem (34) has an effective source plane in the shape of a regular hexagon, and illuminates regular-hexagon-shaped regions on said masks (12, 14), and said regular-hexagon-shaped regions on the masks are so oriented that two of the six sides of each hexagonal region are perpendicular to the scan direction; and (b) each of said projection subsystems (18, 20, 22/26, 28, 30) has an image field in the shape of a regular hexagon, and said regular-hexagon-shaped image field is so oriented that two of its six sides are perpendicular to the scan direction.

3. A two-sided projection imaging system according to claim 2, further characterized in that the effective width, w, of each scan is 1.5 $l_h$, where $l_h$ is the length of each side of said regular-hexagon-shaped illuminated regions on the substrate.

4. A two-sided projection imaging system according to claim 1, further characterized in that said illumination subsystem (34) provides radiation from a mercury lamp.

5. A two-sided projection imaging system according to claim 1, further characterized in that said illumination subsystem (34) provides radiation from a laser source.

6. A two-sided projection imaging system according to claim 5, further characterized in that said laser source is an excimer laser.

7. A projection imaging system according to claim 1, further characterized in that each of said offset reverser means (22/30) to render the image on the substrate in the same orientation as the corresponding mask pattern produces the required image reversal by reflections from mirrors with a predetermined lateral offset.

8. A projection imaging system according to claim 1, further characterized in that each of said offset reverser means (22, 30) to render the image on the substrate in the same orientation as the corresponding mask pattern produces the required image reversal by reflections from mirrors with an adjustable lateral offset.

9. A projection imaging system according to claim 1, further characterized in that each of said offset reverser means (22, 30) to render the image on the substrate in the same orientation as the corresponding mask pattern produces the required image reversal by reflections from a combination of fold mirror and prism elements with a predetermined lateral offset.

10. A projection imaging system according to claim 1, further characterized in that each of said offset reverser means (22, 30) to render the image on the substrate in the same orientation as the corresponding mask pattern produces the required image reversal by reflections from a combination of fold mirror and prism elements with an adjustable lateral offset.

11. A two-sided projection imaging system according to claim 1, further characterized in that said stage subsystem (8) comprises a planar stage with a first and second positions for said first and second masks (12, 14) and a third position for said substrate (10/19), the three positions being image-wise aligned in the same plane for imaging by said projection subsystem (18, 20, 22/26, 28, 30) and said masks being laterally offset from said substrate.

12. A two-sided projection imaging system according to claim 11, further characterized in that said control means (70) provides for realigning said first and second masks (12, 14) and said substrate (10/19) with respect to each other periodically.

13. A two-sided projection imaging system according to claim 11, further characterized in that said lateral offsets of the first and second masks are of equal magnitude in a lateral direction from the center line of the substrate, and said offsets are in opposite directions for the two masks.

14. A two-sided, large-area, high-throughput, high-resolution, scan-and-repeat projection imaging system for replicating patterns present on first and second patterning masks onto substrate segments on two sides of a substrate, characterized by (a) a planar stage subsystem (8) comprising mask locking means and substrate locking means providing fixed juxtaposition, in the same plane, of said first and second masks (12, 14) relative to the substrate, said first and second masks being laterally offset by the same magnitude from the center line of the substrate (10/19) in opposite directions, the three positions being image-wise aligned; said stage subsystem being capable of scanning in one dimension, and when not scanning in that dimension, capable of moving laterally in a direction perpendicular to the scan direction so as to position itself for another scan; said stage subsystem thus being capable of exposing the full substrate by scanning the substrate area in a certain number of parallel strips, exposing each of said strips by scanning the length of the strip across a fixed illumination region;

(b) an illumination subsystem (34) having the wavelength and intensity distribution characteristics suited for exposure of said substrate (10/19), having an effective source plane of a predetermined shape, and capable of illuminating each of said masks (12, 14) with a region of said predetermined shape;

(c) two projection subsystems (18, 20, 22/26, 28, 30) for imaging said illuminated regions of said predetermined shape on both said first mask (12) and said second mask (14) onto both said surfaces of the substrate (10/19), having an object-to-image magnification ratio of unity, having the desired imaging resolution, having offset reverser means (22/30) to render the images on the substrate in the same orientations as the object mask patterns and each with a predetermined lateral offset equal to the lateral offset of the masks to the substrate, the offsets being in opposite directions from each other, and having an image field of said predetermined shape and of an area substantially smaller than the substrate area;

(d) the positions of the upper and lower masks (12,14) and the substrate (10/19) being image-wise aligned in the same plane for imaging by said projection subsystem (18, 20, 22/26, 28, 30); and (e) control means 70 to operatively interrelate said stage (8), said illumination subsystem (34) and said projection subsystems (18, 20, 22/26, 28, 30) to provide additive illumination in certain overlap regions of areas exposed by adjacent scans such that the effect of the exposure dose delivered in said overlap regions is seamless and the effect of the exposure dose delivered across each entire substrate segment is uniform and to assure alignment of said first and second masks to the substrate.

15. A two-sided projection imaging system according to claim 11, further characterized in that said stage subsystem (8) includes means (70) to adjust the relative positions of said first mask (12) and said second mask (14) with respect to the substrate (10/19).

16. A two-sided projection imaging system according to claim 11, further characterized in that said substrate is a discrete and rigid substrate (10).

17. A two-sided projection imaging system according to claim 11, further characterized in that said substrate is a segment (19) of a flexible substrate (11).

18. A two-sided, high-throughput, high-resolution, scan-and-repeat projection imaging system for replicating patterns present on first and second masks onto two sides of each of a sequence of segments (19) of a flexible substrate (11), characterized by (a) a stage (8) comprising locking means for the upper and lower masks (12,14) and for a segment (19) of the flexible substrate (11) in a common plane, providing fixed juxtaposition of the masks (12,14) relative to the flexible substrate segment (19), said stage subsystem (8) being capable of scanning in one dimension, and when not scanning in that dimension, capable of moving laterally in a direction perpendicular to the scan direction so as to position itself for another scan; said stage subsystem (8) thus being capable of exposing a full segment (19) of the flexible substrate (11) by breaking up the substrate segment into a certain number of parallel strips, and exposing each of said strips by scanning the length of the strip across a fixed illumination region;

(b) an illumination subsystem (34) having the wavelength and intensity distribution characteristics suited for exposure of said substrate segment (19), having an effective source plane of a predetermined shape, and capable of illuminating on each of said masks (12, 14) a region of said predetermined shape;

(c) a set of at least two projection subsystems (18, 20, 22/26, 28, 30) for imaging said illuminated regions of said predetermined shape on the masks onto both sides of the substrate, having an object-to-image magnification ratio of unity, having the desired imaging resolution, having offset reverser means (22/30) to render the images on the substrate in the same orientations as the object mask pattern with a predetermined lateral offset, and having an image field of said predetermined shape and of an area substantially smaller than the substrate area;

(d) means for sequentially presenting, affixing and aligning segments (19) of such flexible substrate (11) to said stage (8); and (e) control means (70) to operatively interrelate said stage (8), said illumination system (34) and said projection subsystem (18, 20, 22/26, 28, 30) to provide additive illumination in certain overlap regions of areas exposed by adjacent scans such that the effect of the exposure dose delivered in said overlap regions is seamless and the effect of the exposure dose delivered across the entire substrate is uniform.

19. The method of providing a two-sided, large-area, high-throughput, high-resolution, scan-and-repeat projection imaging system, characterized by the following steps:

1. providing a stage subsystem comprising mask locking means and substrate adjustment locking means in a common plane which enable fixed juxtaposition of the masks (12, 14) relative to the substrate (10/19); said stage subsystem being capable of scanning in one dimension, and when not scanning in that dimension, capable of moving laterally in a direction perpendicular to the scan direction so as to position itself for another scan;

2. providing an illumination subsystem having the wavelength and intensity distribution characteristics suited for exposure of said substrate (10/19), having an effective source plane of a predetermined shape, and capable of illuminating each of said masks (12, 14) with a region of said predetermined shape;

3. providing two projection subsystems (18, 20, 22/26, 28, 30) for imaging said illuminated regions of said predetermined shape on both the first mask (12) and second mask (14) onto both sides of the substrate (10/19), having an object-to-image magnification ratio of unity, having the desired imaging resolution, having offset reverser means (22/30) to render the images on the substrate in the same orientations as the object mask patterns and each with a related predetermined lateral offset, and having an image field of said predetermined shape and of an area substantially smaller than the substrate area;

4. scanning said stage such that the length of both masks traverse said illumination regions of predetermined shape;

5. stopping the stage momentarily after completion of a scan across the length of the masks, moving the stage by a distance equal to 1.5 $l_h$ in a direction perpendicular to the scan direction, and resuming the scanning of the stage in a direction opposite to the scan direction in step 3;

6. repeating steps 4–5 until exposure of both sides of the entire substrate is completed; and 7. providing control means (70) to operatively interrelate said stage (8), said illumination subsystem (34) and said projection subsystems (18, 20, 22/26, 28, 30) to provide additive illumination in certain overlap regions of areas exposed by adjacent scans such that the effect of the exposure dose delivered in said overlap regions is seamless and the effect of the exposure dose delivered across each entire substrate segment is uniform, and to periodically realign the first mask (12), the second mask (14) and the substrate (10/19).

20. The method of providing a projection imaging system according to claim 19, further characterized in that (a) said illumination system has an effective source plane in the shape of a regular hexagon, and is capable of uniformly illuminating a regular-hexagon-shaped region on each of said masks; and (b) each of said projection assemblies has an image field in the shape of a regular hexagon.

21. A multi-sided, large-area, high-throughput, high-resolution, scan-and-repeat projection imaging system for replicating patterns present on multiple patterning masks onto substrate segments on a plurality of sides of a substrate, characterized by (a) a stage subsystem comprising $M_1, M_2 \ldots M_n$ mask locking means and locking means for a substrate of $S_1, S_2 \ldots S_n$ sides, providing fixed juxtaposition of the masks relative to the substrate; said stage subsystem being capable of scanning in one dimension, and when not scanning in that dimension, capable of moving laterally in a direction perpendicular to the scan direction so as to position itself for another scan; said stage subsystem thus being capable of exposing the full substrate by scanning the substrate area in a certain number of parallel strips, exposing each of said strips by scanning the length of the strip across a fixed illumination region;

(b) an illumination subsystem having the wavelength and intensity distribution characteristics suited for exposure of said $S_1, S_2 \ldots S_n$-sided substrate, having an effective source plane of a predetermined shape, and capable of illuminating each of said masks with a region of said predetermined shape;

(c) $P_1, P_2 \ldots P_n$ projection subsystems for imaging said illuminated beam region of said predetermined shape on each of the $M_1, M_1 \ldots M_n$ masks onto each of the $S_1, S_2 \ldots S_n$ sides of the substrate, having an object-to-image magnification ratio of unity, having the desired imaging resolution, having reverser means to render the image in the same orientation as the object mask patterns object, and having an image field of said predetermined shape and of an area substantially smaller than the substrate area; and (d) control means to operatively interrelate said stage subsystem, said illumination subsystem and said projection subsystems to provide additive illumination in certain overlap regions of areas exposed by adjacent scans such that the effect of the exposure dose delivered in said overlap regions is seamless and the effect of the exposure dose delivered across each entire substrate segment is uniform.

22. A precision multi-sided projection imaging system for microelectronics manufacturing by overlapping complementary scans, comprising a stage, an illumination subsystem, means to mount a first mask on said stage, projection subsystem including a first reverser, and control means characterized by means to divide the output beam of said illumination subsystem into N beams of predetermined characteristics;

means to mount additional masks 2 . . . N on said stage in fixed juxtaposition to said first mask;

projection means 1 . . . N for projecting respective mask patterns from said first mask and from masks 2 . . . N onto respectively related segments of said substrate;

further characterized in that said projection subsystem is arranged to provide optical assemblies 1 . . . N which are matched in optical imaging path length and in optical elements including a reverser in each of said optical assemblies.

\* \* \* \* \*